United States Patent [19]

Oguri et al.

[11] Patent Number: 4,761,388

[45] Date of Patent: Aug. 2, 1988

[54] IN ORGANIC FIBERS CONTAINING FINE CRYSTALS OF ALN AND AL₂O₃ AND PROCESS FOR THEIR PRODUCTION

[75] Inventors: Yasuo Oguri; Mitsuru Awata, both of Tokyo; Hozumi Endo, Fuzisawa, all of Japan

[73] Assignee: Mitsubishi Chemical Industries Limited, Tokyo, Japan

[21] Appl. No.: 903,142

[22] Filed: Sep. 3, 1986

[30] Foreign Application Priority Data

Sep. 3, 1985 [JP] Japan .................... 60-194190

[51] Int. Cl.⁴ .................... C04B 35/58; C04B 35/10
[52] U.S. Cl. .................... 501/95; 501/96; 264/DIG. 19; 264/63
[58] Field of Search .................... 501/95, 96; 264/DIG. 19, 63

[56] References Cited

U.S. PATENT DOCUMENTS

| | | | |
|---|---|---|---|
| 3,846,527 | 11/1974 | Winter | 264/63 |
| 4,010,233 | 3/1977 | Winter | 264/63 |
| 4,354,986 | 10/1982 | Maczuga et al. | 264/8 |

FOREIGN PATENT DOCUMENTS

| | | |
|---|---|---|
| 1100865 | 1/1968 | United Kingdom . |
| 1159210 | 7/1969 | United Kingdom . |
| 2127390 | 4/1984 | United Kingdom . |

OTHER PUBLICATIONS

Chemical Abstracts, vol. 104, No. 4, Abstract No. 114880h.

Primary Examiner—William R. Dixon, Jr.
Assistant Examiner—David M. Brunsman
Attorney, Agent, or Firm—Oblon, Fisher, Spivak, McClelland & Maier

[57] ABSTRACT

An inorganic fiber composed essentially of fine crystals of an aluminum compound, which contains at least 10% by weight of aluminum nitride and the rest of the aluminum compound being alumina.

23 Claims, 1 Drawing Sheet

INORGANIC FIBERS CONTAINING FINE CRYSTALS OF ALN AND AL₂O₃ AND PROCESS FOR THEIR PRODUCTION

The present invention relates to an inorganic fiber containing aluminum nitride, particularly an inorganic fiber composed of fine crystals of aluminum nitride and other inorganic compounds, particularly alumina, and a process for its production.

DISCUSSION OF THE BACKGROUND

Aluminum nitride is a prospective material useful in the field of electronics industry by virtue of its excellent heat resistance, electric insulation properties and heat conductivity. Aluminum nitride is prepared in the form of aluminum nitride powder from aluminum metal or from alumina. Various aluminum nitride products are prepared by sintering this aluminum nitride powder.

A desirable aluminum nitride product is aluminum nitride fibers. Aluminum nitride fibers presently known are in the form of whiskers, i.e. single crystal fibers. Polycrystal fibers of aluminum nitride i.e. fibers composed of fine aluminum nitride crystals, have not been known although polycrystal fibers are known which are made of alumina or many other inorganic materials. It is impossible to produce such polycrystal fibers by the conventional method of sintering aluminum nitride powder for the production of an aluminum nitride product.

SUMMARY OF THE INVENTION

Accordingly, it is an object of the present invention to provide fibers comprising aluminum nitride as an essential constituent and a process for their production.

The present invention provides an inorganic fiber composed essentially of fine crystals of an aluminum compound, which contains at least 10% by weight of aluminum nitride and the rest of the aluminum compound being alumina.

Further, the present invention also provides a process for producing inorganic fibers composed essentially of fine crystals of an aluminum compound and containing at least 10% by weight of aluminum nitride, which comprises spinning a viscous solution comprising an aluminum compound and an organic polymer compound to obtain precursory fibers in which the atomic ratio of organic carbon to aluminum is at least 0.5; and heating the precursory fibers at a temperature of at least 1000° C. in a non-oxidizing atmosphere comprising a gas selected from the group consisting of nitrogen and ammonia to convert at least a part of aluminum to aluminum nitride.

BRIEF DESCRIPTION OF THE FIGURES

Now, the present invention will be described in detail with reference to the preferred embodiments.

In the accompanying drawings.

DETAILED DESCRIPTION OF THE PREFERRED EMBODIMENTS

Figure 1:
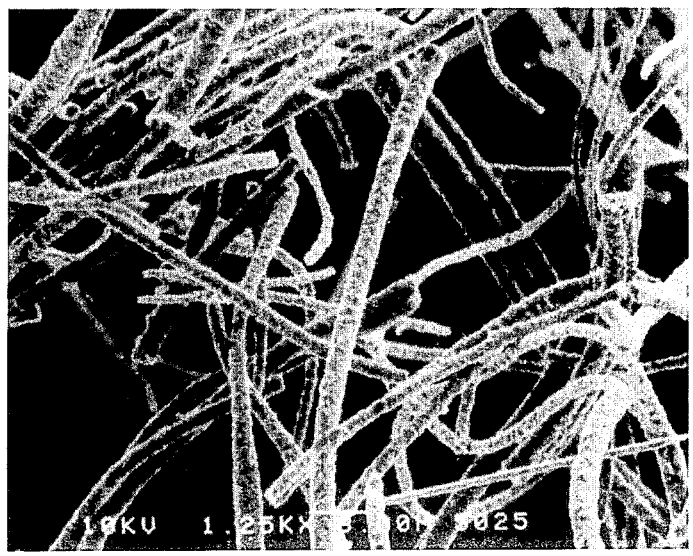
FIG. 1 is an electron microscopic photograph (1,250 magnifications) of the fibers obtained in Example 1.

The inorganic fiber of the present invention contains fine crystals of aluminum nitride as an essential constituent. The content of aluminum nitride is at least 10% by weight, usually at least 50% by weight. A typical example of the fiber of the present invention is an aluminum nitride fiber in which at least 95% by weight is aluminum nitride. The aluminum nitride fiber of the present invention has a polycrystalline structure composed of fine crystals. The size of the fine crystals of aluminum nitride is usually from 0.005 to 1 µm and is preferably from 1/1000 to 1/5 of the diameter of the fiber. The constituent other than aluminum nitride is mainly alumina. Like aluminum nitride, alumina usually has a crystal size of from 0.005 to 1 µm. No other component than aluminum nitride and alumina is usually present. If a further component is present, the amount is usually less than 5% by weight of the fiber. As such a component, a silicon compound such as silicon carbide (SiC) may be mentioned.

With respect to the shape of the inorganic fiber of the present invention, the diameter is usually not more than 20 µm, preferably not more than 10 µm, and the ratio of the length to the diameter is at least 50. A typical fiber of the present invention has a diameter of from about 2 to about 5 µm and a length of at least 10 mm. For the production of the fibers of the present invention, firstly a viscous solution comprising an aluminum compound and an organic polymer compound, is spun to obtain precursory fibers of the aluminum compound. The method for the production of such precursory fibers, is commonly known for the production of alumina fibers by a precursory fiber method (see U.S. patent application Ser. No. 800,026). As the aluminum compound, various aluminum salts such as a nitrate and an acetate, an aluminum alkoxide, alumina, etc. may be employed. However, an aluminum oxychloride represented by the formula $Al(OH)_nCl_{3-n}$ is preferably employed, wherein Al/Cl (atomic ratio) is usually within 1.6 to 1.9.

As the organic polymer compound, polyvinyl alcohol is most common. However, other compounds which are capable of improving the viscosity of the solution of an aluminum compound when added thereto and capable of imparting spinnable properties to the solution, such as polyethylene glycol, polyacrylamide, hydroxyethyl starch, methyl cellulose, hydroxyethyl cellulose and carboxymethyl cellulose, may also be employed. The solution for spinning i.e. the spinning solution is prepared by adding the above-mentioned organic polymer compound to a solution of the above-mentioned aluminum compound and concentrating the solution to a prescribed viscosity. If desired, the preparation may be conducted in such a manner that after concentrating a solution of the aluminum compound, a solution of the organic polymer compound is added thereto to obtain a prescribed viscosity. As distinguished from the case for the production of alumina fibers, the spinning solution used for the production of the precursory fibers of the present invention is required to contain a large amount of the organic component relative to the aluminum component. In the case of alumina fibers, the organic polymer compound in the spinning solution merely serves to impart the spinnable properties to the spinning solution. Whereas, in the present invention, the organic polymer compound in the spinning solution not only imparts the spinnable properties to the spinning solution, but also serves as a reducing agent when the aluminum component in the precursory fibers is converted to aluminum nitride. If the content of the organic substance in the precursory fibers is small, the conversion at the time of converting the aluminum component in the precursory fibers to aluminum nitride tends to be poor. Therefore, it is usual to prepare the spinning solution so that the atomic ratio of the carbon atoms in the organic polymer compound to the aluminum atoms is at least 0.5. A preferred atomic ratio of organic carbon to aluminum in the spinning solution is from 1.5 to 2.5. Even when the ratio of the organic carbon exceeds this range, there is no particular adverse effect for the formation of aluminum nitride, but carbon formed by the thermal decomposition of the organic substance will remain in the resulting inorganic fiber. The inclusion of carbon is not fatal, since such carbon can be oxidized and eliminated without affecting aluminum nitride by heating the fiber containing such carbon in an oxidizing atmosphere at a temperature of from 500 to 700° C.

As mentioned above, the organic polymer compound in the spinning solution has dual functions i.e. a function to impart spinnable properties to the spinning solution and a function as a reducing agent for the formation of aluminum nitride, and a part of the organic polymer compound as the reducing agent can be substituted by other organic compounds so long as the spinnable properties are not impaired. As such organic compounds, there may be employed compounds having relatively small vapor pressures such as carbon black, sucrose or oligosaccharide, i.e. compounds which will be carbonized rather than vaporized during the heating process of the precursory fibers, which process will be described hereinafter.

The spinning solution may contain small amounts of silica or other compounds of metals other than aluminum, as is common in the production of alumina fibers by a precursory fiber method. Such metal compounds are expected to be present as they are or as changed into other compounds, in the inorganic fiber finally produced, and to serve for the prevention of the crystal growth of the aluminum compound.

The spinning may be carried out by various conventional methods commonly employed for the production of precursory fibers. Most simply, spinning nozzles may be disposed in an air stream flowing at a high velocity and the spinning solution may be extruded from the nozzles in parallel with the air stream. The spinning solution ejected from the nozzles is stretched in the air stream into fibers and dried to form precursory fibers. The diameter and the length of the precursory fibers are determined depending upon the desired inorganic fibers to be finally obtained. Namely, the volume of fibers decreases considerably during the process for the conversion of the precursory fibers to inorganic fibers. Accordingly, the shape of the precursory fibers is determined taking such volume reduction into accounts. The volume reduction rate can easily be ascertained by experiments.

The precursory fibers are then heated in a non-oxidizing atmosphere comprising nitrogen or ammonia at a temperature of at least 1000° C., preferably from 1400° to 1700° C. to convert aluminum in the precursory fibers to aluminum nitride. The heating is conducted usually for from 1 to 5 hours. It may be conducted for a long period of time. However, if the fibers are heated at a high temperature for a long period of time, it is likely that fine crystals of aluminum nitride undergo crystal growth, whereby fibers tend to be brittle. On the other hand, if the heating time is too short, the reaction will not adequately proceed, whereby alumina and carbon are likely to remain in the fibers. Under the above conditions, other metal components present in the precursory fibers likewise change into stable compounds. For instance, silica is converted to silicon carbide.

When the amount of the organic compound in the precursory fibers is small, aluminum nitride and alumina will form. Therefore, the mechanism for the formation of aluminum nitride in the present invention is considered to comprise such steps that during the heating, aluminum in the precursory fibers is converted to alumina and the organic substance is converted to carbon, and then aluminum nitride is formed by the reaction of the alumina, carbon and nitrogen, as represented by the following formula:

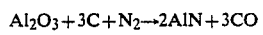

$$Al_2O_3 + 3C + N_2 \rightarrow 2AlN + 3CO$$

According to the present invention, an inorganic fiber composed of aluminum nitride, or of aluminum nitride and alumina, can readily be prepared. The inorganic fiber of the present invention is composed of aluminum nitride or of aluminum nitride and alumina, and thus has higher heat conductivity than the fiber composed solely of alumina. Accordingly, the inorganic fiber of the present invention is useful particularly in the field where the electric insulation and heat conductivity are required, for instance, for the production of printed circuit boards in the form of a composite material with an epoxy resin.

Now, the present invention will be described in further detail with reference to Examples. However, it should be understood that the present invention is by no means restricted by these specific Examples.

EXAMPLE 1

To 1 liter of an aqueous aluminum oxychloride solution [Al/Cl (atomic ratio)=1.8, aluminum content: 87 g/liter], 1645 g of an aqueous solution containing 10% by weight of polyvinyl alcohol, was mixed. The mixed solution was concentrated at 50° C. under reduced pressure to obtain a spinning solution having a viscosity of about 50 poise and an aluminum content of 104 g/liter. This spinning solution was extruded from nozzles disposed in an air stream flowing at a high velocity, in parallel with the air stream, and spun. The precursory fibers thus obtained had a diameter of from 0.2 to 15 $\mu$m and a length of from 2 to 30 mm. The precursory fibers were heated in a nitrogen stream at a temperature rising rate of 2° C./min from room temperature to 700° C. and at a rate of 10° C./min from 700° to 1550° C., and maintained at 1550° C. for 5 hours.

Figure 2:
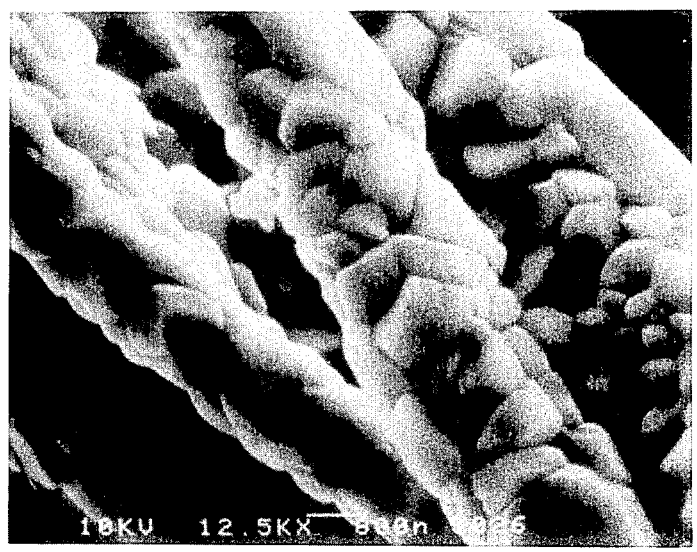
FIG. 2 is an electron microscopic photograph of the same fibers with 12,500 magnifications.

The fibers thus obtained were grey and had a diameter of from 0.1 to 10 $\mu$m and a length of from 1 to 20 mm. From the results of the X-ray diffraction, the fibers were found to be composed solely of aluminum nitride, and no diffraction peaks were detected for alumina or other substances. The fibers were further heated in a nitrogen stream at 1800° C. for 30 minutes, and then electron microscopic photographs (see FIG. 1 for 1,250 magnifications and FIG. 2 for 12,500 magnifications) were taken, from which the fibers were found to be composed of fine crystals having a particle size of from submicrons to 1 $\mu$m. Thus, the fibers obtained by the heating at 1550° C. for 5 hours were found to be aluminum nitride fibers composed of fine crystals.

EXAMPLE 2

Inorganic fibers were prepared in the same manner as in Example 1 except that the time for maintaining at 1550° C. in Example 1 was shortened from 5 hours to 2 hours.

The fibers thus obtained were grey, and had a diameter of from 0.1 to 10 μm and a length of from 1 to 20 mm. From the results of the X-ray diffraction, the fibers were found to be composed of aluminum nitride and α-alumina, with the ratio of AlN/Al$_2$O$_3$=98/2.

EXAMPLE 3

Inorganic fibers were prepared in the same manner as in Example 1 except that the amount of the aqueous polyvinyl alcohol solution added in Example 1, was changed from 1645 g to 330 g, and the viscosity of the spinning solution was adjusted to about 100 poise and the aluminum content was adjusted to 230 g/liter.

The fibers thus obtained were white, and had a diameter of from 1 to 20 μm and a length of from 10 to 50 mm. From the results of the X-ray diffraction, the fibers were found to be composed of aluminum nitride and α-alumina, with the ratio of AlN/Al$_2$O$_3$=12/88.

EXAMPLE 4

Inorganic fibers are prepared in the same manner as in Example 1 except that the heating temperature in Example 1 is changed from 1550° C. to 1200° C.

The fibers thereby obtainable are grey and have a diameter of from 0.1 to 10 μm and a length of from 1 to 20 mm.

The fibers are composed of aluminum nitride and α-alumina, with the ratio of AlN/Al$_2$O$_3$ being about 15/85.

EXAMPLE 5

Inorganic fibers are prepared in the same manner as in Example 1 except that the aqueous polyvinyl alcohol solution in Example 1 is changed to 16,450 g of an aqueous solution containing 1% by weight of polyethylene glycol, and the viscosity of the spinning solution is adjusted to about 100 poise and the aluminum content is adjusted to 40 g/liter.

The fibers thereby obtainable are grey and have a diameter of from 2 to 20 μm and a length of from 10 to 40 mm.

The fibers are composed of aluminum nitride, and no diffraction peaks are observed for alumina or other substance.

EXAMPLE 6

Inorganic fibers are prepared in the same manner as in Example 1 except that the aqueous polyvinyl alcohol solution in Example 1 is changed to 16,450 g of an aqueous solution containing 1% by weight of polyacrylamide, and the viscosity of the spinning solution is adjusted to about 100 poise and the aluminum content is adjusted to 12 g/liter.

The fibers thereby obtainable are grey and have a diameter of from 3 to 20 μm and a length of from 10 to 50 mm.

The fibers are composed of aluminum nitride, and no diffraction peaks are observed for alumina or other substances.

We claim:

1. An inorganic fiber composed essentially of fine crystals of an aluminum compound, which contains at least 10% by weight of aluminum nitride and the rest of the aluminum compound being alumina.

2. The inorganic fiber according to claim 1, wherein the content of the aluminum compound is at least 95% by weight and the content of other inorganic compounds is less than 5% by weight.

3. The inorganic fiber according to claim 2, wherein the content of aluminum nitride is at least 50% by weight.

4. The inorganic fiber according to claim 3, which has a diameter of not more than 20 μm and a ratio of the length to the diameter being at least 50.

5. An inorganic fiber composed essentially of fine crystals of aluminum nitride, which has a diameter of not more than 20 μm and a ratio of the length to the diameter being at least 50.

6. A process for producing inorganic fibers composed essentially of fine crystals of an aluminum compound and containing at least 10% by weight of aluminum nitride, said process comprising:
   (a) spinning a viscous solution comprising an aluminum compound and an organic polymer compound to obtain precursor fibers in which the atomic ratio of organic carbon to aluminum is at least 0.5;
   (b) heating said precursor fibers at a temperature of at least 1,000° C. in a non-oxidizing atmosphere comprising a gas selected from the group consisting of nitrogen and ammonia to convert at least part of said aluminum compound in said precursor fibers to aluminum nitride; and
   (c) obtaining inorganic fibers composed essentially of fine crystals of an aluminum compound and containing at least 10% by weight of aluminum nitride, said fibers having a diameter of from 2 to 20 micrometers and a length to diameter ratio of at least 50 wherein said aluminum nitriate, aluminum acetate, and aluminum alkoxide, alumina, or an aluminum oxychloride.

7. The process of claim 6, comprising heating the fibers obtained in step (b) at a temperature of from 500° to 700° C. in an oxidizing atmosphere to remove carbon contained in said fibers.

8. The process of claim 6, wherein said aluminum compound is substantially the only metal compound contained in said viscous solution.

9. The process of claim 6, wherein said atomic ratio of organic carbon to aluminum in said viscous solution is from 1.5 to 2.5.

10. The process of claim 6, comprising using a temperature of from 1400° to 1700° C. in step (b).

11. The process of claim 6, comprising heating said precursor fibers in step (b) until the content of aluminum nitride reaches 95 wt.% of the inorganic fiber obtained.

12. The process of claim 6, comprising obtaining inorganic fibers having fine crystals having a size of from 0.005 to 1 micrometers.

13. The process of claim 6, comprising obtaining inorganic fibers having fine crystals wherein the size of said fine crystals is from 1/1000 to 1/5 of the diameter of said fibers.

14. The process of claim 6, wherein said inorganic fibers obtained in step (c) are made of aluminum nitride and alumina.

15. The process of claim 14, wherein said inorganic fibers obtained are composed essentially of fine crystals of aluminum nitride having a size of from 0.005 to 1 micrometers and fine crystals of alumina having a crystal size of from 0.005 to 1 micrometers.

16. The process of claim 6, comprising obtaining inorganic fibers containing aluminum nitride, alumina and less than 5% by weight of a silicon compound.

17. The process of claim 6, comprising obtaining inorganic fibers in step (c) having a diameter of not more than 10 micrometers.

18. The process of claim 6, comprising obtaining inorganic fibers in step (c) having a diameter of from 2 to about 5 micrometers and a length of at least 10 mm.

19. The process of claim 6, wherein said organic polymer compound comprises a polyvinyl alcohol, a polyethyleneglycol, a polyacrylamide, a hydroxyethyl starch, a methyl cellulose, a hydroxyethyl cellulose or a carboxymethyl cellulose.

20. The process of claim 6, comprising spinning a viscous solution in step (a) having an atomic ratio of carbon atoms in said organic polymer compound to aluminum atoms of at least 0.5.

21. The process of claim 20, wherein said atomic ratio of carbon atoms in said organic polymer compound to said aluminum atoms is from 1.5 to 2.5.

22. The process of claim 6, comprising using nitrogen in step (b).

23. The process of claim 6, comprising using ammonia in step (b).

* * * * *

UNITED STATES PATENT AND TRADEMARK OFFICE
CERTIFICATE OF CORRECTION

PATENT NO. : 4,761,388
DATED : Aug. 2, 1988
INVENTOR(S) : Yasuo OGURI, et al.

It is certified that error appears in the above-identified patent and that said Letters Patent is hereby corrected as shown below:

On Title page, and in Column 1, Line 2, "IN ORGANIC" should be:

--INORGANIC--.

Signed and Sealed this

Ninth Day of May, 1989

Attest:

DONALD J. QUIGG

*Attesting Officer*  *Commissioner of Patents and Trademarks*